(12) United States Patent
Fukada et al.

(10) Patent No.: US 7,642,099 B2
(45) Date of Patent: Jan. 5, 2010

(54) MANUFACTURING METHOD FOR FERROELECTRIC MEMORY DEVICE

(75) Inventors: Shinichi Fukada, Hamura (JP); Naoya Sashida, Kawasaki (JP)

(73) Assignees: Seiko Epson Corporation (JP); Fujtisu Limited (JP)

(*) Notice: Subject to any disclaimer, the term of this patent is extended or adjusted under 35 U.S.C. 154(b) by 21 days.

(21) Appl. No.: 11/998,177

(22) Filed: Nov. 28, 2007

(65) Prior Publication Data

US 2008/0145954 A1 Jun. 19, 2008

(30) Foreign Application Priority Data

Nov. 29, 2006 (JP) ............................. 2006-321467

(51) Int. Cl.
*H01L 21/00* (2006.01)
(52) U.S. Cl. .................. 438/3; 438/240; 257/E21.478; 257/E21.584
(58) Field of Classification Search ...................... 438/3, 438/785, 240; 257/E21.478, E21.584
See application file for complete search history.

(56) References Cited

U.S. PATENT DOCUMENTS

| | | | |
|---|---|---|---|
| 2005/0181559 A1* | 8/2005 | Natori et al. | 438/253 |
| 2005/0280059 A1* | 12/2005 | Takano | 257/295 |
| 2006/0180894 A1* | 8/2006 | Kumura et al. | 257/532 |

* cited by examiner

*Primary Examiner*—Caridad M Everhart
(74) *Attorney, Agent, or Firm*—Harness, Dickey & Pierce, P.L.C.

(57) ABSTRACT

A manufacturing method for a ferroelectric memory device includes: forming a ferroelectric capacitor on a substrate, the ferroelectric capacitor including a lower electrode, a ferroelectric film, and an upper electrode; forming a first hydrogen barrier film that covers the ferroelectric capacitor by a chemical vapor deposition method; forming a dielectric film on the first hydrogen barrier film; forming a sidewall composed of the dielectric film on a side of the ferroelectric capacitor by etching back the dielectric film; forming a second hydrogen barrier film on the first hydrogen barrier film and the sidewall by a chemical vapor deposition method; and forming an interlayer dielectric film on the second hydrogen barrier film.

3 Claims, 5 Drawing Sheets

MANUFACTURING METHOD FOR FERROELECTRIC MEMORY DEVICE

CROSS-REFERENCE TO RELATED APPLICATION

This application claims priority from Japanese Patent Application No. 2006-321467, filed on Nov. 29, 2006, the contents of which are incorporated herein by reference.

BACKGROUND

1. Technical Field

The present invention relates to a manufacturing method for a ferroelectric memory device having a ferroelectric capacitor.

2. Related Art

A ferroelectric memory device is generally provided with a ferroelectric capacitor having a ferroelectric film composed of metal oxides. In the process for manufacturing such a ferroelectric memory device, if the ferroelectric film, after having been formed, is exposed to a reductive atmosphere such as hydrogen ($H_2$) or water ($H_2O$), the ferroelectric film is reduced, such that the electrical characteristics of the ferroelectric material is changed, causing a deterioration of the ferroelectric capacitor characteristics. In order to prevent this hydrogen damage, usually, a dielectric film having a hydrogen barrier function (AlOx or the like) is deposited on the capacitor as a hydrogen barrier film, after the capacitor is formed. For example, Japanese Unexamined Patent Application, First Publication No. 2004-119978 may be an example of relevant art. According to a known method in which hydrogen barrier films are provided, two hydrogen barrier films are formed. For example, Japanese Unexamined Patent Application, First Publication No. 2005-183843 may be an example of relevant art.

In case of a ferroelectric memory device having capacitors in a stacked structure, the capacitors can be densely disposed, and a ferroelectric memory cell array can be composed. However, when the capacitors are densely placed, a gap-fill technique is required for filling gaps between the capacitors with dielectric films. If the capacitors are covered by a dielectric layer without completely filling of the gaps between the capacitors, unfilled portions remain as voids, residual gas may stay there, and the gas causes the deterioration of the ferroelectric material with the passage of time, whereby the device reliability is lowered.

When gaps between adjacent capacitors are large enough, the capacitors could be covered without voids by an ordinary film forming method, such as, for example, a CVD method, without any special gap-fill technique.

However, in recent years, there have been greater demands for further miniaturization and higher integration of ferroelectric memory devices, and there are also demands for higher density in the capacitor arrangement. For example, the gap between adjacent capacitors is required to be less than 0.5 μm. When the gap between adjacent capacitor becomes so narrow, it would be difficult to fill the gap with the ordinary film forming method described above.

Generally, in ordinary wiring processes of the semiconductor manufacturing, narrow gaps between Al wirings are filled with high-density plasma (HDP) $SiO_2$ films or SOG (spin-on-glass) films which have excellent coverage abilities.

However, in the process for manufacturing ferroelectric memory devices, gaps between the capacitors need to be filled without deteriorating the characteristics of the ferroelectric capacitors as described above, and this requirement causes greater difficulty compared to the case of filling gaps between metal wirings. The characteristics of the capacitors are damaged by both the high density plasma and the chemical attach of the hydrogen or water generated during the HDP or SOG film formation. For this reason, dielectric film forming and gap-filling techniques without any damage to the capacitor are required.

SUMMARY

The present invention provides a manufacturing method for a ferroelectric memory device, which enables higher capacitor density described above and prevents the device reliability lowering due to deterioration of the characteristics of the capacitors.

An aspect of the invention provides a manufacturing method for a ferroelectric memory device including: forming a ferroelectric capacitor on a substrate, the ferroelectric capacitor including a lower electrode, a ferroelectric film, and an upper electrode; forming a first hydrogen barrier film that covers the ferroelectric capacitor by a chemical vapor deposition method; forming a dielectric film on the first hydrogen barrier film; forming a sidewall composed of the dielectric film on a side of the ferroelectric capacitor by etching back the dielectric film; forming a second hydrogen barrier film on the first hydrogen barrier film and the sidewall by a chemical vapor deposition method; and forming an interlayer dielectric film on the second hydrogen barrier film.

According to the manufacturing method for a ferroelectric memory device described above, a first hydrogen barrier film and a dielectric film that cover the ferroelectric capacitors are formed. The dielectric film is etched back thereby forming sidewalls on side sections of the ferroelectric capacitors. Then, a second hydrogen barrier film is formed on the sidewalls by a chemical vapor deposition method. Therefore, in a narrow gap portion between adjacent ones of the capacitors, the major part of the gap can be filled by the sidewalls, and a gap remaining between the sidewalls can be filled with a second hydrogen barrier film. More specifically the second hydrogen barrier film can fill the narrow gap between the sidewalls excellently by the aluminum oxide film that has excellent coverage property for example. Furthermore, in a wide gap portion between adjacent ones of the capacitors, the first hydrogen barrier film may be exposed as a result of the etching back process of the dielectric film, and the second hydrogen barrier film is deposited on the first hydrogen barrier film directly, and the interlayer dielectric film is further deposited on it such that the gap is excellently filled. Because aluminum oxide has a high etching resistance, forming contact holes therein is a rather difficult process, and a thick aluminum oxide film gives a disadvantage to the process. However, by the manufacturing method in accordance with the present invention, the major part of the gap between adjacent capacitors can be filled with sidewalls of the dielectric film, such that a small gap remaining between the sidewalls can be desirably filled, even if a rather thin barrier film is used as the second hydrogen barrier film.

Also, the ferroelectric capacitor is covered by the first and the second hydrogen barrier films, and the ferroelectric capacitor is well guarded from the hydrogen attack. Accordingly, by the manufacturing method in accordance with the aspect of the invention, a ferroelectric memory device can be obtained with a higher capacitor density and preventing the reliability lowering due to deterioration of the characteristics.

It is preferable that, in the manufacturing method for the ferroelectric memory device of the aspect of the invention, both the first and the second hydrogen barrier films are composed of aluminum oxide.

As described above, aluminum oxide film deposited by the CVD method has excellent coverage, such that relatively narrow gaps between capacitors and narrow gaps between sidewalls can be desirably filled.

It is more preferable that, the first and the second hydrogen barrier films are deposited by an atomic layer chemical vapor deposition (ALCVD) method.

By the atomic layer chemical vapor phase deposition method that is a type of chemical vapor deposition methods, the coverage property can be improved, such that, even when a gap between the sidewalls becomes narrower, this narrow gap can be reliably filled.

It is preferable that, in the manufacturing method for the ferroelectric memory device of the aspect of the invention, a heat treatment to the sidewall be conducted between the forming of the sidewall and the forming of the second hydrogen barrier film by a chemical vapor deposition method.

As a result, even when moisture or hydrogen remain in the sidewall, the heat treatment can remove it from the sidewall. If moisture or hydrogen remains in the sidewall, it sealed by the second hydrogen barrier film at the next step, and cannot be removed thereafter. Therefore, this moisture or hydrogen would diffuse into the dielectric films of the product, which cause deterioration of the capacitor characteristics and damage the device reliability. However, by removing moisture and hydrogen from the sidewall before forming the second hydrogen barrier film, by the heat treatment, deterioration of the characteristics can be reliably prevented.

DESCRIPTION OF EXEMPLARY EMBODIMENTS

Figure 1:
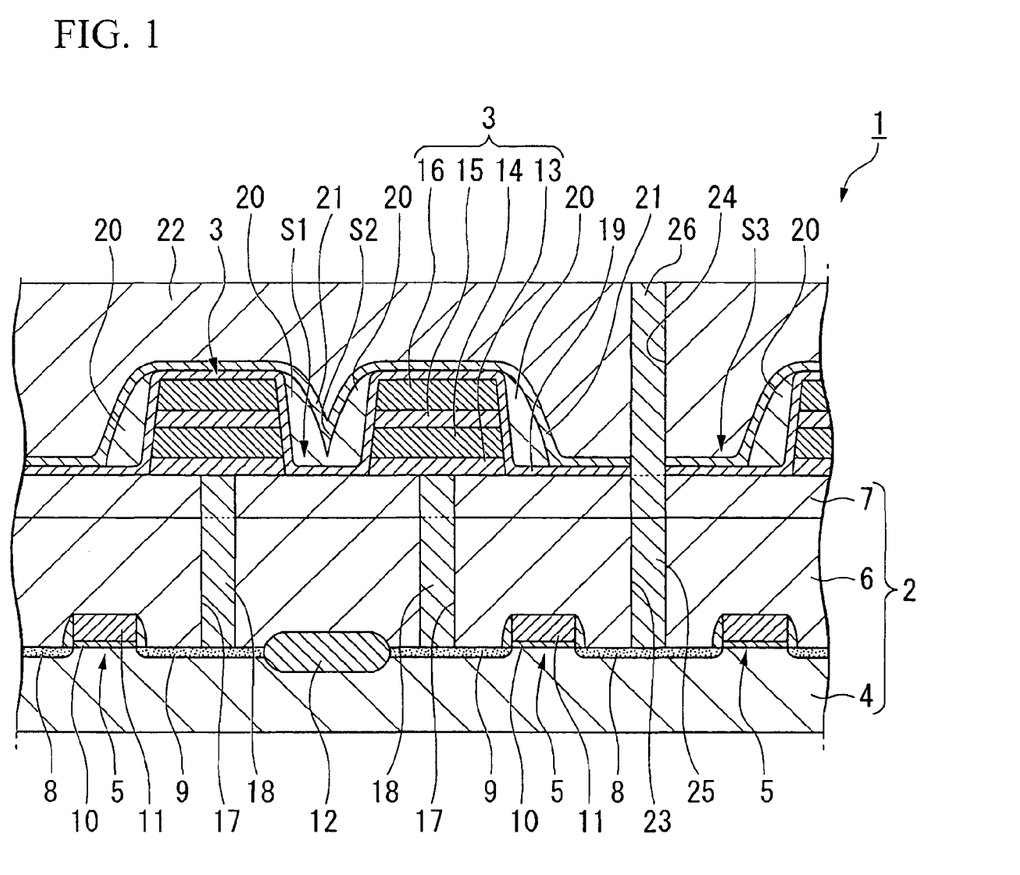
FIG. 1 is a cross-sectional view in part of an example of a ferroelectric memory device in accordance with an embodiment of the invention.

Preferred embodiments of the invention are described in detail below. Prior to describing a manufacturing method for a ferroelectric memory device in accordance with an embodiment of the invention, an example of the ferroelectric memory device obtained by the method is described. FIG. 1 is a schematic cross-sectional view of a ferroelectric memory device manufactured by the manufacturing method in accordance with an embodiment of the invention. Reference numeral 1 in the figure denotes a ferroelectric memory device. The ferroelectric memory device 1 is a 1T/1C memory cell structure with a stacked type capacitor, and is equipped on a base substrate 2, and ferroelectric capacitors 3 provided on the base substrate 2. This embodiment is described with reference to a 1T/1C type memory cell structure, but the invention is not limited to a 1T/1C type.

The base substrate 2 is formed on a silicon substrate (a semiconductor substrate) 4. Transistors 5 for operating the ferroelectric capacitors 3 are formed on a top surface portion of the silicon substrate 4. A first base dielectric film 6 and a second base dielectric film 7 that cover the transistors 5 are laminated on the silicon substrate 4.

Source regions 8, drain regions 9, and channel regions (not shown) constituting the transistors 5 are formed in the silicon substrate 4, and gate dielectric films 10 are formed over the channel regions. Furthermore, gate electrodes 11 are formed on the gate dielectric films 10, thereby forming the transistors 5, respectively. The transistors 5 corresponding to the respective ferroelectric capacitors 3 are electrically isolated from one another by embedded isolation regions 12 formed in the silicon substrate 4.

The first base dielectric film 6 and the second base dielectric film 7 may be composed of silicon oxide ($SiO_2$), and planarized by a CMP (chemical mechanical polishing) method or the like. The first base dielectric film 6 and the second base dielectric film 7 are divided from each other because of the following reason. The interlayer dielectric film to be formed on the transistors 5 is relatively thick, and contact holes to be formed in the interlayer dielectric film become too deep to fill the holes with the wiring metals at once. Therefore, if the required film thickness of an interlayer dielectric film to be formed on the transistors 5 is relatively small, the film does not need to be divided in two layers, and the base dielectric film can be formed in a single layer.

Over the base substrate 2 where the transistors 5 are formed on the silicon substrate 4, and the first base dielectric film 6 and the second base dielectric film 7 are further formed, the ferroelectric capacitors 3 are formed. Each of the ferroelectric capacitors 3 is formed from an oxygen barrier film 13 formed on the second base dielectric film 7, a lower electrode 14 formed on the oxygen barrier film 13, a ferroelectric film 15 formed on the lower electrode 14, and an upper electrode 16 formed on the ferroelectric film 15.

The oxygen barrier film 13 may be composed of, for example, TiAlN, TiAl, TiSiN, TiN, TaN, TaSiN or the like. Above all, TiAlN containing titanium, aluminum and nitrogen is suitable, and the oxygen barrier film 13 is formed from TiAlN in this embodiment.

The lower electrode 14 and the upper electrode 16 may be formed from, for example, iridium (Ir), iridium oxide (IrOx), platinum (Pt), ruthenium (Ru), ruthenium oxide (RuOx) or the like, and are formed from iridium in this embodiment.

The ferroelectric film 15 is composed of material having a perovskite crystal structure, which may be expressed by a general formula, $ABXO_3$, having a perovskite crystal structure. Specifically, the ferroelectric film 15 is composed of Pb (Zr, Ti) $O_3$ (PZT), (Pb, La) (Zr, Ti) $O_3$ (PLZT), or a ferroelectric material in which metal such as niobate (Nb) or the like is added to the foregoing material. In this embodiment, the ferroelectric film 15 is formed from PZT.

The oxygen barrier film 13 is connected at its bottom portion to a contact hole 17 formed in a manner to penetrate the second base dielectric film 7 and the first base dielectric film 6. With this structure, the lower electrode 14 on the oxygen barrier film 13 is conductively connected with a plug 18 formed in the contact hole 17 via the oxygen barrier film 13. The plug 18 is connected to the drain region 9 of the transistor 5, whereby the ferroelectric capacitor 3 is operated by the transistor 5, as described above. The plug 18 embedded in the contact hole 17 is formed from tungsten (W) in this embodiment.

Also, a dielectric first hydrogen barrier film 19 that covers the ferroelectric capacitors 3 is formed on the second base dielectric film 7. As the material of the dielectric first hydrogen barrier film 19, aluminum oxide such as alumina (AlOx), titanium oxide such as titania (TiOx), zircon oxide such as zirconia (ZrOx), or the like may be used, and in particular, alumina (AlOx) is preferably used. Accordingly, in the exemplary embodiment, the first hydrogen barrier film 19 is composed of alumina (AlOx).

Sidewalls 20 are formed on side wall sections (side sections) of the ferroelectric capacitor 3. The sidewalls 20 are formed from dielectric films composed of $SiO_2$ as described below. In particular, the sidewalls 20 fill a very narrow gap portion S1 between adjacent ones of the ferroelectric capacitors 3, which is, for example, as small as 0.5 μm or less. However, the sidewalls 20 alone would not completely embed the gap S1 between the ferroelectric capacitors 3 due to the manufacturing process, as described below.

Accordingly, in the ferroelectric memory device 1, a second hydrogen barrier film 21 is formed on the first hydrogen barrier film 19 and the sidewalls 20. As a result, a gap S2 slightly remaining between the adjacent ferroelectric capacitors 3 whose gap is very narrow, where the gap S1 cannot be sufficiently embedded by the sidewalls 20 alone as described above, is filled well by the second hydrogen barrier film 21. As the material composing the second hydrogen barrier film 21, alumina (AlOx: an oxide of aluminum) is preferably used, like the first hydrogen barrier film 19. Accordingly, in this embodiment, the second hydrogen barrier film 21 is also composed of alumina (AlOx).

In an area where a gap between adjacent ones of the ferroelectric capacitors 3 is relatively wide (S3), a portion of the gap S3 is embedded by the sidewalls 20 of the ferroelectric capacitors 3, but the remaining portion is not embedded and the first hydrogen barrier film 19 is exposed. As the second hydrogen barrier film 21 is formed in such a state, the second hydrogen barrier film 21 is directly laminated on the first hydrogen barrier film 19 in the gap S3 other than the portions where sidewalls 20 are formed.

An interlayer dielectric film 22 is formed on the second hydrogen barrier film. By this, the gaps S2 (S1) and S3 are embedded and sealed by the interlayer dielectric film 22 without forming voids, in other words, without trapping gas therein.

A contact hole 24 connecting to the contact hole 23 that opens in particular in the gap S3 is formed in the interlayer dielectric film 22 in a manner to penetrate the first hydrogen barrier film 19 and the second hydrogen barrier film 21. A plug 25 composed of tungsten (W) is embedded in the contact hole 23, and a plug 26 composed of tungsten (W) is embedded in the contact hole 24.

Also, a contact hole (not shown) that reaches the upper electrode 16 of the ferroelectric capacitor 3 is formed in the interlayer dielectric film 22 in a manner to penetrate the first hydrogen barrier film 19 and the second hydrogen barrier film 21, and a plug (not shown) conductively connecting to the upper electrode 16 is formed in the contact hole. Also, wirings connecting to the plug (not shown) and the plug 26 are formed on the interlayer dielectric film 22. The ferroelectric capacitor 3 having the structure described above is driven by the transistor 5 and the wirings (not shown) conductively connected to the upper electrode 16. Furthermore, another interlayer dielectric film (not shown) covering the wirings is formed on the interlayer dielectric film 22.

Next, a manufacturing method for a ferroelectric memory device in accordance with an embodiment of the invention is described based on the manufacturing method for the ferroelectric memory device 1 having the structure described above.

Figure 2A:
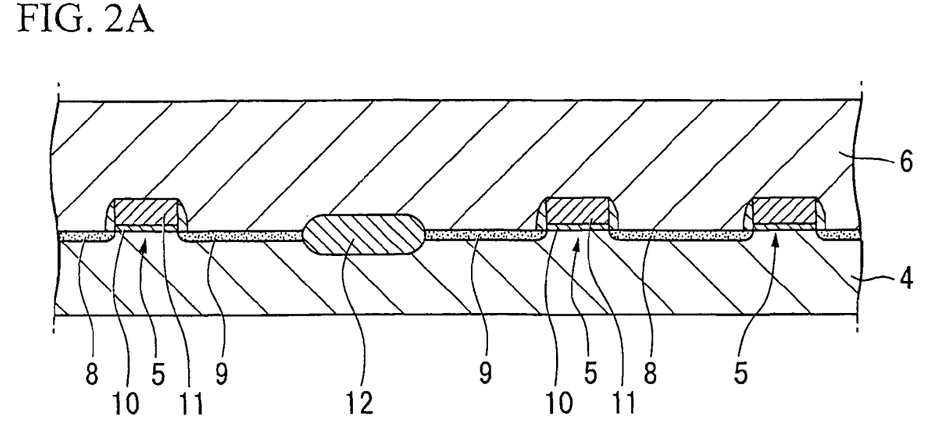
FIGS. 2A to 2C are views for describing of a manufacturing method for the device shown in FIG. 1.

First, as shown in FIG. 2A, transistors 5 are formed in advance on a silicon substrate 4 by a known method. Then, a silicon oxide ($SiO_2$) film is formed by a CVD method or the like, and planarized by a CMP method, thereby forming a first base dielectric film 6.

Figure 2B:
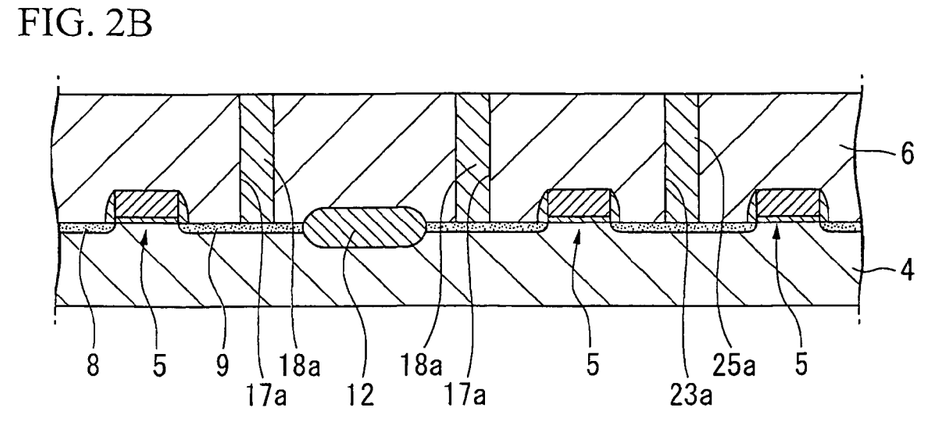

Then, a resist pattern (not shown) is formed on the first base dielectric film 6 by known resist technique and exposure and development technique, and etching is conducted by using the resist pattern as a mask, thereby forming lower portions 17a of contact holes 17 and lower portions 23a of contact holes 23, as shown in FIG. 2B.

Then, tungsten (W) is deposited as a plug material by a CVD method or the like, thereby embedding the lower portions 17a of the contact holes 17 and the lower portions 23a of the contact holes 23 with the tungsten. Then, portions of the tungsten layer on the base dielectric film 6 are removed by a CMP method or the like, thereby embedding lower portion 18a of plugs 18 composed of tungsten in the lower portions 17a of the contact hole 17, and lower portions 25a of contact holes 25 composed of tungsten in the lower portions 23a of the contact holes 23. When forming the plug lower portions, preferably, an adhesion layer composed of TiN (titanium nitride) or the like may be thinly formed on inner wall surfaces of the lower portions 17a and lower portions 23a prior to embedding tungsten, and then tungsten may be embedded as described above.

Figure 2C:
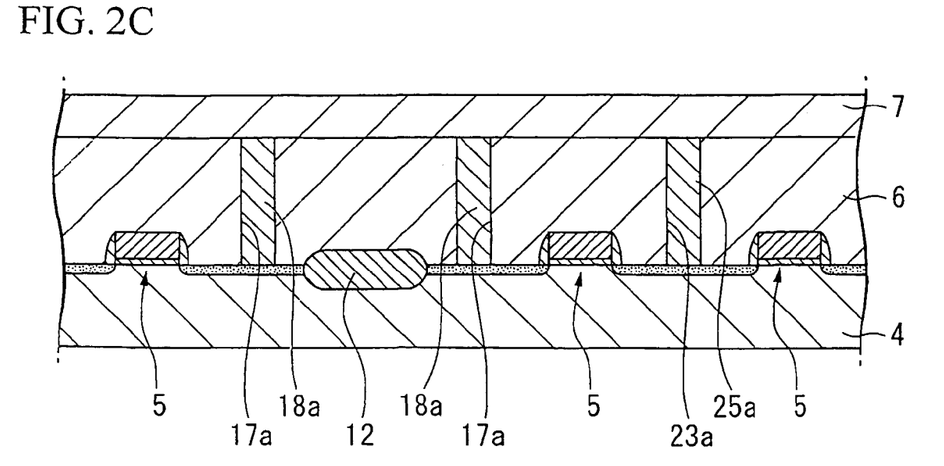

When the lower portions 18a of the plugs 18 and the lower portions 25a of the plugs 25 are formed, a second base dielectric film 7 is formed on the first base dielectric film 6, as shown in FIG. 2C. Prior to this step, for example, a SiON (not shown) film may be formed on the first base dielectric film 6 by a CVD method or the like, to prevent oxidation of the plug lower portions. The second base dielectric film 7 may be formed through forming a film of silicon oxide ($SiO_2$) by a CVD method or the like, and planarizing the film by a CMP method or the like.

Figure 3A:
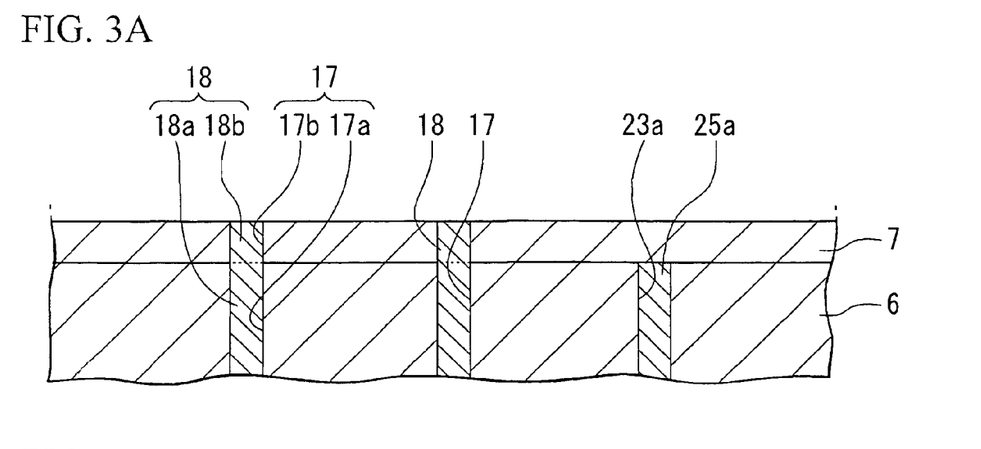
FIGS. 3A to 3C are views for describing of the manufacturing method for the device shown in FIG. 1.

Then, ferroelectric capacitors 3 are formed on the second base dielectric film 7. Prior to this step, the contact holes 17 and plugs 18 that are to be conductively connected to the ferroelectric capacitors 3 are completed, as shown in FIG. 3A. More specifically, a resist pattern (not shown) is formed on the second base dielectric film 3 by known resist technique and exposure and development technique, and the second base dielectric film 7 is etched in portions immediately above the lower portions 17a of the contact holes 17 by using the resist pattern as a mask. By this, upper portions 17b of the contact holes 17 are formed, and the contact holes 17 having the lower portions 17a and the upper portions 17 continuous to one another are obtained. At this time, the plug lower portions within the lower portions 17a of the contact holes 17 function as etching stopper layers. In the descriptions on the figures after FIG. 3A, descriptions about the lower side of the first base dielectric film 6 are omitted.

Then, upper portions of the plugs 18 are embedded in the upper portions 17a of the contact holes 17, like the step of embedding the plug lower portions described above, whereby the continuous plugs 18 are obtained. When forming the plug upper portions, preferably, an adhesion layer composed of TiN (titanium nitride) or the like may also be formed in advance on inner wall surfaces of the upper portions 17b of the contact holes 17, as described above.

Figure 3B:
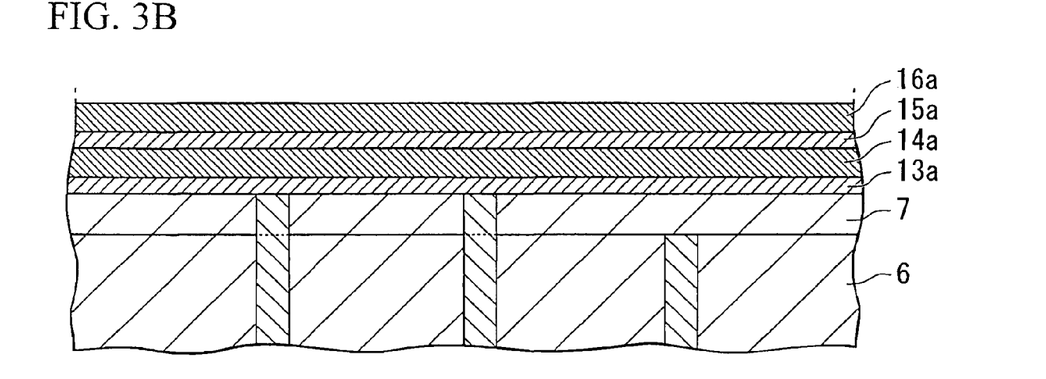

Then, for forming the ferroelectric capacitors 3 on the second base dielectric film 7, first, a film of material for forming an oxygen barrier film 13, covering the upper surface of the plugs 18, is formed on the second base dielectric film 7. Concretely, a film of TiAlN is formed by a sputter method or the like, thereby forming an oxygen barrier layer 13a, as shown in FIG. 3B.

Then, a film of material for forming a lower electrode 14 such as iridium is formed by a sputter method or the like on the oxygen barrier layer 13a, thereby forming a lower electrode layer 14a.

Then, a film of material for forming a ferroelectric film 15 such as PZT is formed by, for example, a sputter method, a spin-on method, a MOCVD method, or a sol-gel method, thereby forming a ferroelectric layer 15a.

Then, a film of material for forming an upper electrode 16 such as iridium is formed by a sputter method or the like on the ferroelectric layer 15a, thereby forming an upper electrode layer 16a.

Figure 3C:
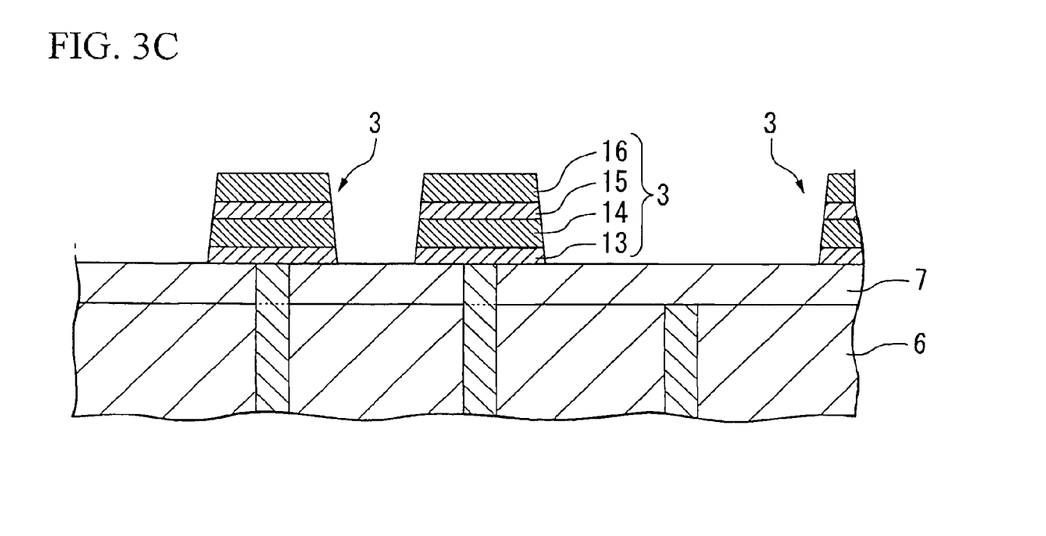

Then, a resist pattern (not shown) is formed on the upper electrode layer 16a by known resist technique and exposure and development technique, and by using the resist pattern as a mask, the upper electrode layer 16a, the ferroelectric layer 15a, the lower electrode layer 14a and the oxygen barrier layer 13a are etched together, or etched in multiple times while changing the etching condition, thereby patterning the layers. As a result, as shown in FIG. 3C, ferroelectric capacitors 3 each formed from the oxygen barrier film 13, the lower electrode 14, the ferroelectric film 15 and the upper electrode 16 are obtained.

Figure 4A:
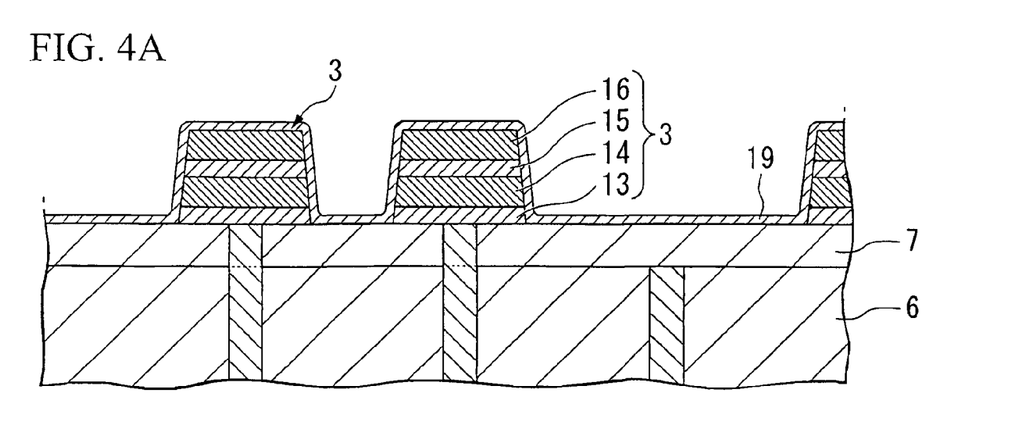
FIGS. 4A to 4C are views for describing of the manufacturing method for the device shown in FIG. 1.

When the ferroelectric capacitors 3 are formed, a film of AlOx that covers the ferroelectric capacitors 3 is formed on the first base dielectric film 7 by a CVD method (chemical vapor deposition method), thereby forming a first hydrogen barrier film 19. The film thickness of the hydrogen barrier film 19 may not be particularly limited, but may be, for example, approximately 5 to 20 nm.

Forming a film of AlOx by a CVD method provides excellent coverage, such that the first hydrogen barrier film 19 composed of AlOx excellently covers not only top but side of the ferroelectric capacitors 3. To obtain better coverage, the use of an atomic layer deposition method (ALD method) may be particularly preferable among CVD methods (ALD and ALCVD are, therefore the same meaning.). Accordingly, in accordance with this embodiment, the first hydrogen barrier film 19 composed of AlOx is formed by an ALD method.

The ALD method is a kind of the CVD method that uses TMA (trimethyl aluminum) as a source gas and gases that does not contain hydrogen, such as, ozone, NO or the like as oxidizing gases. By the ALD method described above, the ferroelectric capacitors 3 can be covered well, and an AlOx film is formed with an oxidizing agent, such that the characteristics of the ferroelectric films 15 of the ferroelectric capacitors 3 would not be deteriorated.

The ferroelectric films 15 in the ferroelectric capacitors 3 may have oxygen deficiency depending on their film forming condition. Accordingly, after the first hydrogen barrier film 19 has been formed, a heat treatment may be conducted in an oxygen atmosphere if necessary, whereby oxygen may be supplied to the ferroelectric films 15 through the first hydrogen barrier film 19 composed of AlOx to compensate the oxygen deficiency. The heat treatment may be conducted at temperatures, for example, ranging from 550° C. to 750° C., and more preferably, 600° C. to 750° C.

Figure 4B:
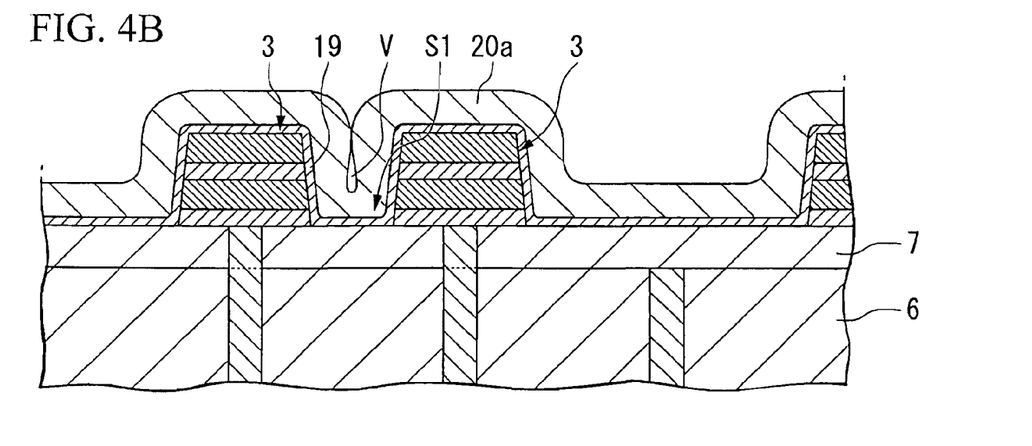

Next, as shown in FIG. 4B, a dielectric film 20a is formed on the first hydrogen barrier film 19 thereby covering the same. As a method for forming the dielectric film 20a, a film forming method that causes smaller damage to the ferroelectric capacitors 3 should be selected, and therefore plasma damaging HDP method or hydrogen rich SOG method cannot be used. Therefore, in this embodiment, a plasma CVD method using TEOS (tetraethoxysilane) as a source material (a plasma TEOS method) is used. The plasma TEOS method may cause only a substantially small damage to the ferroelectric capacitors 3, but may not provide excellent coverage. Accordingly, a void V may be formed by the dielectric film 20a particularly at a narrow gap S1 between the ferroelectric capacitors 3.

Also, the dielectric film 20a is later etched back as described below, and therefore it is not desirable to form the film too thick from the point of the productivity. However, it is necessary to embed the major part of the gap S1 by sidewalls 20 to be obtained after the etch-back, and therefore the thickness of the dielectric film 20a may preferably be about half the dimension (width) of the gap S1.

As a method for forming the dielectric film 20a, a sputter method to form a film of $SiO_2$ may be enumerated as a film forming method that is also known as a method causing rather small damage. However, this method does not have an excellent coverage property similar to the plasma TEOS.

Figure 4C:
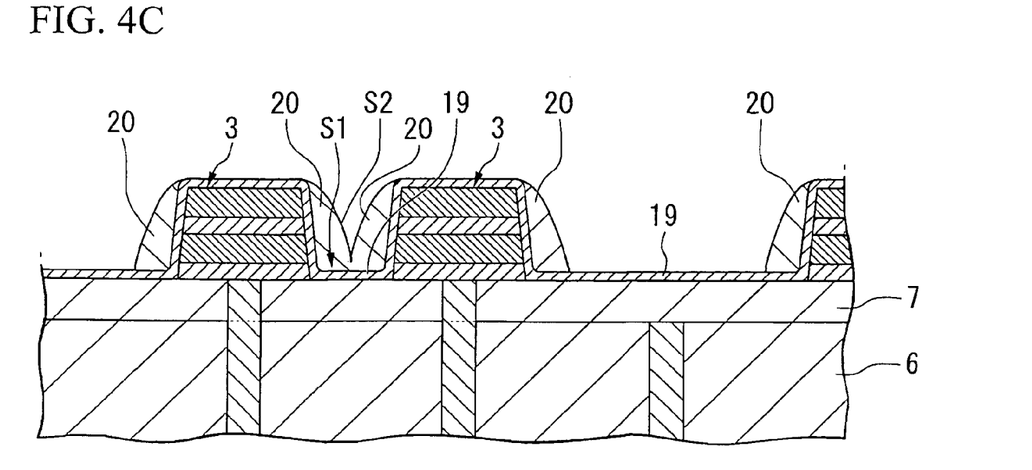

Then, the dielectric film 20a is etched back, thereby forming sidewalls 20 on side wall sections (side sections) of the ferroelectric capacitors 3 on the first hydrogen barrier film 19, as shown in FIG. 4C. As a result, an upper portion of the aforementioned void V formed in the dielectric film 20a in the narrow gap S1 between the ferroelectric capacitors 3 is removed by the etch-back, thereby forming a gap S2. Also, by this etch-back, the dielectric film 20a between the sidewalls 20 formed in the wide gap S3 between the ferroelectric capacitors 3 is removed, and the first hydrogen barrier film 19 is exposed.

A little amount of the hydrogen and water remain in the sidewalls 20 thus formed, and there is a danger that they would gradually diffuse in the ferroelectric capacitors little by little during the steps to be conducted later. In particular, because a second hydrogen barrier film will be formed on the sidewalls 20, the remaining hydrogen and water are sealed under the second hydrogen barrier film and therefore they cause rather severe damage to the capacitor even though the amount of them is a little. Accordingly, it is effective to conduct a heat treatment for removing the remaining hydrogen and water from the sidewalls 20, prior to forming the second hydrogen barrier film. Concretely, the treatment may be conducted in an oxygen or hydrogen atmosphere at 450° C. to 600° C.

Figure 5A:
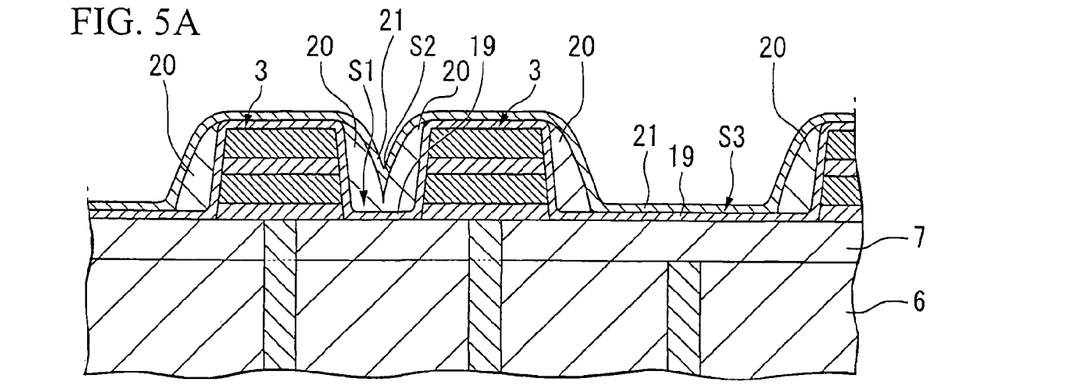
FIGS. 5A to 5C are views for describing of the manufacturing method for the device shown in FIG. 1.

Then, as shown in FIG. 5A, a film of AlOx that covers the first hydrogen barrier film 19 and the sidewalls 20 is formed again, as a second hydrogen barrier film 21. The second hydrogen barrier film 21 may also be formed by an ALD method that provides particularly excellent coverage among CVD methods, and its film forming condition may be similar to the film forming condition for forming the first hydrogen barrier film 19. The second hydrogen barrier film 21 needs to embed the aforementioned gap S2, and therefore is formed thicker than the first hydrogen barrier film 19, which is, for example, approximately 20 to 50 nm in thickness. As the second hydrogen barrier film 21 formed by the ALD method provides particularly excellent coverage, the gap S2 formed between the sidewalls 20 in the gap S1 can be filled well, whereby a deep concave section (gap) can disappear from the gap S1.

Even when the void V formed in the narrow gap S1 remains between the ferroelectric capacitors 3 as shown in FIG. after the dielectric film 20a has been etched back, the void V would be filled with AlOx arrived from the sides of the void V as the second hydrogen barrier film 21 has excellent coverage property, whereby the void V disappears consequently.

Accordingly, a portion above the base substrate 2 after the second hydrogen barrier film 21 has been formed has a state in which the narrow gap S1 between the ferroelectric capacitors 3 is desirably filled by the first hydrogen barrier film 19, the sidewalls 20 and the second hydrogen barrier film 21, as shown in FIG. 5A. On the other hand, in the wide gap S3 between the ferroelectric capacitors 3, the first hydrogen barrier film 19 and the second hydrogen barrier film 21 are directly laminated.

Figure 5B:
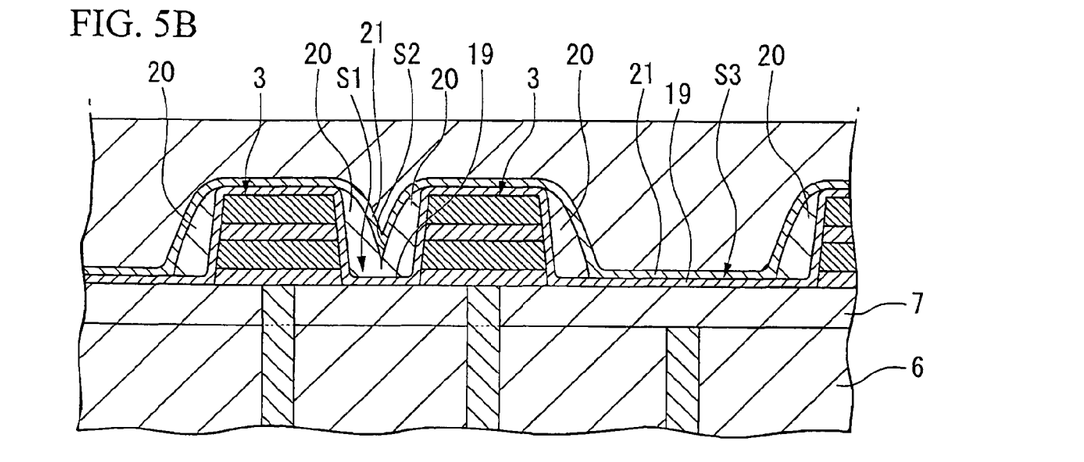

Then, a film of silicon oxide ($SiO_2$) is formed on the second hydrogen barrier film 21 by a CVD method or the like, and then the film is planarized by a CMP method or the like, whereby an interlayer dielectric film 22 is formed as shown in FIG. 5B.

Figure 5C:
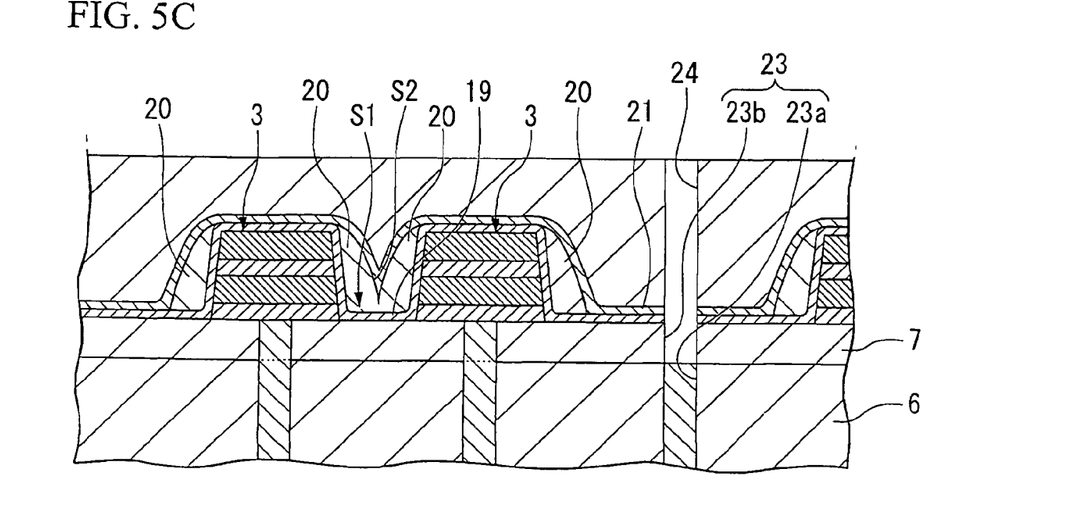

Then, for forming an upper portion 23b of the contact hole 23 and a contact hole 24 to be continuous to the lower portion 23a of the contact hole 23 located in the gap S3 between the ferroelectric capacitors 3, a resist pattern (not shown) is formed by known resist technique and exposure and development technique on the interlayer dielectric film 22. Then, using the resist pattern as a mask, portions of the interlayer dielectric film 22, the second hydrogen barrier film 21, the first hydrogen barrier film 19 and the second base dielectric film 7 immediately above the lower portion 23a of the contact hole 23 are etched. As a result, the contact hole 24 is formed, and the upper portion 23b of the contact hole 23 connecting to the contact hole 24 is formed, as shown in FIG. 5C.

As the aforementioned etching method, a RIE method (reactive ion etching method) with gases containing fluorine as an etchant, an ICP (induction coupling plasma) etching method, an ECR (electron cyclotron resonance) plasma etching method may be used.

The second hydrogen barrier film 21 piles up directly on the first hydrogen barrier film 19 composed of AlOx (which is highly resistant to etching), and these layers become a single layer in practice. Therefore, the difficulty of the contact hole etching is eased compared with that of etching the multilayered dielectrics containing two AlOx layers, as the AlOx monolayer is not so severe obstruction to the process. Accordingly, while deterioration of the characteristic of the ferroelectric capacitors 3 is prevented well by the two hydrogen barrier films, the productivity of forming contact holes can be equal to the case of a hydrogen barrier film provided in a single layer.

Then, in a manner similar to the embedding the plugs 18, an upper portion of the plug 25 and a plug 26 are embedded in the upper portion 23b of the contact hole 23 and in the contact hole 24, respectively, as shown in FIG. 1.

Then, contact holes (not shown) connecting to the upper electrodes 16 are formed in the interlayer dielectric film 22, and plugs (not shown) are embedded in the contact holes. Then, another interlayer dielectric film (not shown) may be formed on the interlayer dielectric film 22, whereby a ferroelectric memory device 1 is obtained.

According to the manufacturing method for a ferroelectric memory device 1, a first hydrogen barrier film 19 and a dielectric film 20 that cover ferroelectric capacitors 3 are formed, the dielectric film 20a is etched back to form sidewalls 20 at side sections of the ferroelectric capacitors 3, and then a second hydrogen barrier film 21 is formed on the sidewalls 20 by an ALD method. As a result, in a narrow gap S1 between the ferroelectric capacitors 3 in particular, the major part of the gap S1 is filled with the sidewalls 20, and a gap S2 remaining between the sidewalls 20 can be filled with a second hydrogen barrier film 21. In other words, aluminum oxide (AlOx) that has excellent coverage property is used as the second hydrogen barrier film 21, and is formed in a film by an ALD method that provides excellent coverage, such that the narrow gap S2 between the sidewalls 20 can be desirably filled.

Also, in a wide gap S3 between the ferroelectric capacitors 3, although the first hydrogen barrier film 19 is exposed as a result of etching back the dielectric film 20a, the second hydrogen barrier film 21 is laminated on the first hydrogen barrier film 19, and an interlayer dielectric film 22 is further laminated thereon, whereby the gap S3 can also be desirably embedded.

Also, because the ferroelectric capacitors are covered by two layers of the first hydrogen barrier film 19 and the second hydrogen barrier film 20, the resistance of the ferroelectric capacitors 3 to hydrogen can be well secured.

Consequently, according to the manufacturing method described above, a highly reliable ferroelectric memory device 1 that can achieve a higher density of ferroelectric capacitors 3 and prevent a reduction in the reliability due to deterioration of the capacitor characteristics can be obtained.

The ferroelectric memory device 1 thus obtained is applicable to various electronic devices, such as, for example, cellular phones, personal computers, liquid crystal devices, electronic notebooks, pagers, POS terminals, IC cards, mini-disc players, liquid crystal projectors, engineering workstations (EWS), word processors, televisions, view finder or monitor-direct viewing type video recorders, electronic desktop calculators, car-navigation systems, devices equipped with touch-panels, clocks, gaming devices, and electrophoretic devices.

Also, the invention is not limited to the embodiment described above, and many changes can be made without departing from the subject matter of the invention. For example, in the embodiment described above, the steps for forming the contact holes 24 and embedding the plugs 26 and the steps for forming contact holes connecting to the upper electrodes 16 and embedding the plugs are conducted independently from one another, but these steps can be commonly conducted in the same steps.

What is claimed is:

1. A manufacturing method for a ferroelectric memory device, comprising:
    forming a ferroelectric capacitor on a substrate, the ferroelectric capacitor including a lower electrode, a ferroelectric film, and an upper electrode;
    forming a first hydrogen barrier film that covers the ferroelectric capacitor by an atomic layer deposition method;
    forming a dielectric film on the first hydrogen barrier film;
    forming a sidewall composed of the dielectric film on a side of the ferroelectric capacitor by etching back the dielectric film;
    forming a second hydrogen barrier film on the first hydrogen barrier film and the sidewall by an atomic layer deposition method; and
    forming an interlayer dielectric film on the second hydrogen barrier film.

2. A manufacturing method for a ferroelectric memory device according to claim 1, wherein
    the first hydrogen barrier film and the second hydrogen barrier film are composed of aluminum oxide.

3. A manufacturing method for a ferroelectric memory device according to claim 1, wherein
    a heat treatment to the sidewall is conducted between the forming of the sidewall and the forming of the second hydrogen barrier film by a chemical vapor deposition method.

* * * * *

UNITED STATES PATENT AND TRADEMARK OFFICE
CERTIFICATE OF CORRECTION

PATENT NO.        : 7,642,099 B2
APPLICATION NO.   : 11/998177
DATED             : January 5, 2010
INVENTOR(S)       : Shinichi Fukada et al.

It is certified that error appears in the above-identified patent and that said Letters Patent is hereby corrected as shown below:

Title Page:

Item [73], Assignees: "Seiko Epson Corporation (JP); Fujtisu Limited (JP)" should be --Seiko Epson Corporation (JP); Fujitsu Limited (JP)--

Signed and Sealed this

Fifteenth Day of June, 2010

David J. Kappos
*Director of the United States Patent and Trademark Office*